(12) United States Patent
Yu et al.

(10) Patent No.: US 8,987,078 B2
(45) Date of Patent: Mar. 24, 2015

(54) METAL SEMICONDUCTOR ALLOY CONTACT WITH LOW RESISTANCE

(71) Applicants: International Business Machines Corporation, Armonk, NY (US); GLOBALFOUNDRIES Inc., Grand Cayman (KY)

(72) Inventors: Jian Yu, Danbury, CT (US); Jeffrey B. Johnson, Essex Junction, VT (US); Zhengwen Li, Danbury, CT (US); Chengwen Pei, Danbury, CT (US); Michael Hargrove, Clinton Corners, NY (US)

(73) Assignees: International Business Machines Corporation, Armonk, NY (US); GLOBAL FOUNDRIES, Inc., Grand Cayman (KY)

( * ) Notice: Subject to any disclaimer, the term of this patent is extended or adjusted under 35 U.S.C. 154(b) by 0 days.

(21) Appl. No.: 14/028,957

(22) Filed: Sep. 17, 2013

(65) Prior Publication Data

US 2014/0017862 A1     Jan. 16, 2014

Related U.S. Application Data

(62) Division of application No. 12/961,553, filed on Dec. 7, 2010, now Pat. No. 8,569,810.

(51) Int. Cl.
| | |
|---|---|
| *H01L 21/336* | (2006.01) |
| *H01L 21/8238* | (2006.01) |
| *H01L 29/66* | (2006.01) |
| *H01L 21/285* | (2006.01) |
| *H01L 21/768* | (2006.01) |
| *H01L 23/485* | (2006.01) |
| *H01L 29/49* | (2006.01) |
| *H01L 29/51* | (2006.01) |

(52) U.S. Cl.
CPC .... *H01L 29/66477* (2013.01); *H01L 21/28518* (2013.01); *H01L 21/76814* (2013.01); *H01L 21/76831* (2013.01); *H01L 23/485* (2013.01); *H01L 29/495* (2013.01); *H01L 29/4966* (2013.01); *H01L 29/517* (2013.01); *H01L 29/518* (2013.01); *H01L 29/66545* (2013.01); *H01L 2924/0002* (2013.01)
USPC ................................. 438/197; 257/E21.001

(58) Field of Classification Search
CPC .................................................. H01L 29/66477
USPC ................................. 438/197; 257/E21.001
See application file for complete search history.

(56) References Cited

U.S. PATENT DOCUMENTS

| | | |
|---|---|---|
| 5,652,180 A | 7/1997 | Shinriki et al. |
| 5,668,065 A | 9/1997 | Lin |

(Continued)

*Primary Examiner* — David S Blum
(74) *Attorney, Agent, or Firm* — Scully, Scott, Murphy & Presser, P.C.; Yuanmin Cai (57) ABSTRACT

A method of forming a semiconductor device is provided that includes forming a gate structure on a channel portion of a semiconductor substrate, forming an interlevel dielectric layer over the gate structure, and forming a opening through the interlevel dielectric layer to an exposed surface of the semiconductor substrate containing at least one of the source region and the drain region. A metal semiconductor alloy contact is formed on the exposed surface of the semiconductor substrate. At least one dielectric sidewall spacer is formed on sidewalls of the opening. An interconnect is formed within the opening in direct contact with the metal semiconductor alloy contact.

19 Claims, 4 Drawing Sheets

(56) References Cited

U.S. PATENT DOCUMENTS

| | | |
|---|---|---|
| 5,747,367 A | 5/1998 | Kadosh et al. |
| 5,834,846 A | 11/1998 | Shinriki et al. |
| 6,001,729 A | 12/1999 | Shinriki |
| 6,136,705 A | 10/2000 | Blair |
| 6,265,271 B1 | 7/2001 | Thei et al. |
| 6,509,253 B1 | 1/2003 | Yu |
| 7,510,922 B2 | 3/2009 | Hall et al. |
| 7,557,032 B2 | 7/2009 | Nejad et al. |
| 7,939,420 B2 | 5/2011 | Disney et al. |
| 2011/0062502 A1* | 3/2011 | Yin et al. ............ 257/288 |
| 2012/0299069 A1 | 11/2012 | Kuhn et al. |

* cited by examiner

METAL SEMICONDUCTOR ALLOY CONTACT WITH LOW RESISTANCE

RELATED APPLICATIONS

This application is a divisional of U.S. patent application Ser. No. 12/961,553, filed Dec. 7, 2010 the entire content and disclosure of which is incorporated herein by reference.

BACKGROUND

The present disclosure relates to semiconductor devices. More particularly, the present disclosure relates to metal semiconductor alloy contacts to semiconductor devices.

For more than three decades, the continued miniaturization of metal oxide semiconductor field effect transistors (MOSFETs) has driven the worldwide semiconductor industry. Various showstoppers to continued scaling have been predicated for decades, but a history of innovation has sustained Moore's Law in spite of many challenges. Since it has become increasingly difficult to improve MOSFETs and therefore complementary metal oxide semiconductor (CMOS) performance through continued scaling, methods for improving performance without scaling are being considered. One approach for doing this is to increase carrier (electron and/or hole) mobilities.

SUMMARY

In one embodiment, a method of forming a semiconductor device is provided in which the metal semiconductor alloy contacts that are contained within trenches to the source and drain regions of the semiconductor device are positioned in close proximity to the gate structure of the semiconductor device. The interconnect to the metal semiconductor alloy contact is separated from the gate structure by a dielectric sidewall spacer that is present on the sidewalls of the opening to the source and drain regions and reduces the incidence of shorting between the interconnect and the gate structure. In one embodiment, the method of forming the semiconductor device includes forming a gate structure on a channel portion of a semiconductor substrate, wherein a source region and a drain region are present on opposing sides of the channel portion of the semiconductor substrate. An interlevel dielectric layer is formed over the gate structure. An opening is formed through the interlevel dielectric layer to an exposed surface of the semiconductor substrate that contains at least one of the source region and the drain region. A metal semiconductor alloy contact is formed on the exposed surface of the semiconductor substrate. At least one dielectric sidewall spacer is formed on the sidewalls of the opening to the source and drain regions. The at least one dielectric sidewall spacer is present overlying a portion of the metal semiconductor alloy contact. An interconnect is formed within the opening to the source and drain regions, and is in direct contact with the metal semiconductor alloy contact.

In another aspect, a semiconductor device is provided that includes a gate structure on a channel portion of a semiconductor substrate. A source region and a drain region are present on opposing sides of the channel portion of the semiconductor substrate. An interlevel dielectric layer is present on the semiconductor substrate, the source region, the drain region and the gate structure. An opening is present through the interlevel dielectric layer to the source and drain region of the semiconductor substrate. At least one dielectric sidewall spacer is present in direct contact with a sidewall of the opening. A metal semiconductor alloy contact is present at a base portion of the opening and extends into the semiconductor substrate. A portion of the metal semiconductor alloy contact that extends into the semiconductor substrate is present under and in direct contact with a base surface of the at least one dielectric sidewall spacer that is present on the sidewall of the opening to the source and drain region. An interconnect fills the opening to the source regions and the drain regions. The interconnect is present in contact with the metal semiconductor alloy contact and the at least one dielectric sidewall spacer.

DESCRIPTION OF THE SEVERAL VIEWS OF THE DRAWINGS

The following detailed description, given by way of example and not intended to limit the disclosure solely thereto, will best be appreciated in conjunction with the accompanying drawings, wherein like reference numerals denote like elements and parts, in which.

DETAILED DESCRIPTION

Detailed embodiments of the claimed structures and methods are disclosed herein; however, it is to be understood that the disclosed embodiments are merely illustrative of the claimed structures and methods that may be embodied in various forms. In addition, each of the examples given in connection with the various embodiments are intended to be illustrative, and not restrictive. Further, the figures are not necessarily to scale, some features may be exaggerated to show details of particular components. Therefore, specific structural and functional details disclosed herein are not to be interpreted as limiting, but merely as a representative basis for teaching one skilled in the art to variously employ the methods and structures of the present disclosure.

References in the specification to "one embodiment", "an embodiment", "an example embodiment", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper", "lower", "right", "left", "vertical", "horizontal", "top", "bottom", and derivatives thereof shall relate to the disclosed structures and methods, as oriented in the drawing figures. The terms "overlying", "atop", "positioned on" or "positioned atop" mean that a first element, such as a first structure, is present on a second element, such as a second structure, wherein intervening elements, such as an interface structure may be present between the first element and the second element. The term "direct contact" means that a first element, such as a first structure, and a second element, such as a second structure, are connected without any intermediary conducting, insulating or semiconductor layers at the interface of the two elements.

The present disclosure relates to metal semiconductor alloy contacts. A "metal semiconductor alloy" is an alloy of a metal and semiconductor. An alloy is homogeneous mixture or solid solution, in which the atoms of the metal are replacing or occupying interstitial positions between the atoms of the semiconductor.

The metal semiconductor alloy contacts may be formed to semiconductor devices, such as field effect transistors (FETs). A field effect transistor (FET) is a semiconductor device in which output current, i.e., source-drain current, is controlled by the voltage applied to a gate structure. A field effect transistor (FET) has three terminals, i.e., a gate structure, a source and a drain region. The gate structure is a structure used to control output current, i.e., flow of carriers in the channel portion, of a semiconducting device, such as a field effect transistor (FET), through electrical or magnetic fields. The channel portion of the substrate is the region between the source region and the drain region of a semiconductor device that becomes conductive when the semiconductor device is turned on. The source region is a doped region in the semiconductor device, in which majority carriers are flowing into the channel portion. The drain region is the doped region in semiconductor device located at the end of the channel portion, in which carriers are flowing out of the semiconductor device through the drain region.

When forming semiconductor devices, such as field effect transistors, using replacement gate methods, the metal semiconductor alloy contacts to the source and drain regions of the semiconductor device are typically formed in trenches, i.e., openings to the source and drain region, that extend through a dielectric layer, such as an interlevel dielectric layer. The dielectric layer also provides the opening to the channel portion of the semiconductor substrate that contains the functioning gate structure, once the sacrificial gate has been removed. It has been determined that forming metal semiconductor alloy contacts on the upper surface of the source region and the drain region that is defined by the trench openings, i.e., openings to the source and drain regions that are formed through the interlevel dielectric layer, results in increased resistance of the contact to the channel portion of the substrate. In comparison to metal semiconductor alloy contacts that are not confined within the trench, and extend along an entire upper surface of the source and drain regions substantially to the sidewall of the gate structure, metal semiconductor alloy contacts that are contained within trench openings increase the resistance of the contact. The metal semiconductor alloy contacts that are contained within trenches have an increased resistance, because a semiconductor region that is free of higher conductivity metal is present between the metal semiconductor alloy contact that is contained within the trench and the channel portion of the semiconductor device. Further, moving the trench that contains the metal semiconductor alloy contacts closer to the gate structure typically results in increased shorting of the gate structure to the interconnect that is contained within the trench.

In one embodiment, the methods and structures of the present disclosure provide a lower resistance metal semiconductor alloy contact to the source region and drain region of a semiconductor substrate by forming a wider metal semiconductor alloy that is in closer proximity to the gate structure of the semiconductor device. In one embodiment, the methods and structures of the present disclosure reduce the incidence of shorting between the gate structure and the interconnect to the metal semiconductor alloy contact by positioning at least one dielectric sidewall spacer on the sidewalls of the openings through the interlevel dielectric layer to the source and drain regions of the device, wherein the at least one dielectric sidewall spacer is present between the interconnect that is contained within the openings to the source and drain regions and the gate structure.

Figure 1:
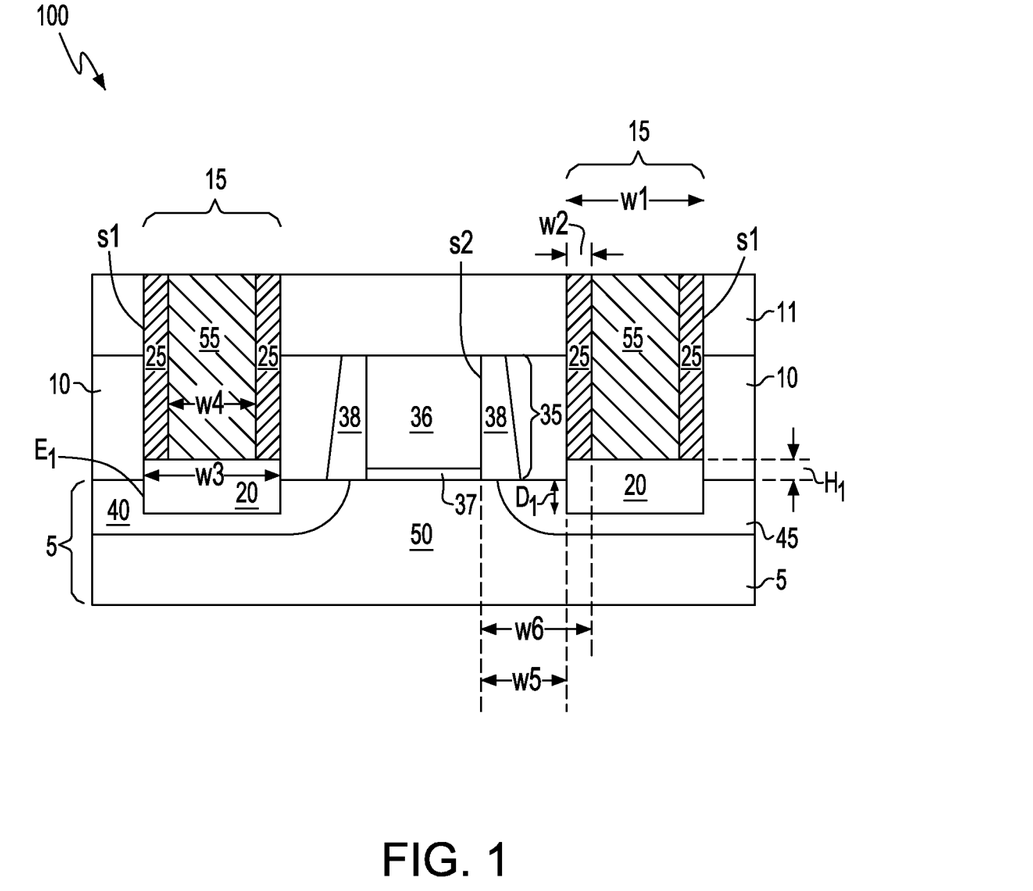
FIG. 1 is a side cross-sectional view of one embodiment of a semiconductor device that includes a metal semiconductor alloy contact that is present in an opening, i.e., trench or via, to the source and drain regions of the semiconductor device, wherein the opening further includes a dielectric sidewall spacer on the sidewalls of the opening and an interconnect to the metal semiconductor alloy contact, in accordance with the present disclosure.

FIG. 1 depicts one embodiment of a semiconductor device 100 that includes metal semiconductor alloy contacts 20 that are present at a base portion of the openings 15 through an interlevel dielectric 10 and extend into the semiconductor substrate 5. The metal semiconductor alloy contacts 20 are present under and in direct contact with a base surface of the at least one dielectric sidewall spacer 25. The semiconductor device 100 depicted in FIG. 1 may be a field effect transistor (FET). A field effect transistor (FET) is a semiconductor device in which output current, i.e., source-drain current, is controlled by the voltage applied to a gate structure 35. A field effect transistor (FET) has three terminals, i.e., a gate structure 35, a source region 40 and a drain region 45. The gate structure 35 is a structure used to control output current, i.e., flow of carriers in the channel 50, of a semiconducting device 100, such as a field effect transistor, through electrical or magnetic fields. The channel 50 is the region between the source region 40 and the drain region 45 of a field effect transistor (FET) that becomes conductive when the semiconductor device 100 is turned on. The source region 40 is a doped region in the transistor, in which majority carriers are flowing into the channel 50. The drain region 45 is the doped region in transistor located at the end of the channel 50, in which carriers are flowing out of the semiconductor device 100 through the drain region 45. Although the semiconductor device 100 that is depicted in FIG. 1 is a field effect transistor (FET), the metal semiconductor alloy contacts 20 of the present disclosure are suitable for any semiconductor device including complementary metal oxide semiconductor (CMOS) devices, bipolar junction transistor (BJT) semiconductor devices, schottky barrier semiconductor devices, and finFET semiconductor devices.

The semiconductor substrate 5 may be composed of a silicon containing material. Si-containing materials include, but are not limited to, Si, single crystal Si, polycrystalline Si, SiGe, single crystal silicon germanium, polycrystalline silicon germanium, or silicon doped with carbon, amorphous Si and combinations and multi-layers thereof. In one embodiment, the semiconductor substrate 5 is composed of a single crystal material, such as single crystal silicon. As used herein, the term "single crystal" denotes a crystalline solid, in which the crystal lattice of the entire sample is substantially continuous and substantially unbroken to the edges of the sample, with substantially no grain boundaries.

The semiconductor substrate 5 is not limited to only silicon containing materials, as the semiconductor substrate 5 may be composed of any semiconducting material, such as compound semiconductors including Ge, GaAs, InAs and other like semiconductors. In the example, that is depicted in FIG. 1, the semiconductor substrate 5 is a bulk-semiconductor substrate. Although not depicted in FIG. 1, the semiconductor substrate 5 may include layered semiconductors, such as Si/Ge and Silicon-On-Insulators.

Referring to FIG. 1, the gate structure 35 may include at least a gate conductor 36 atop a gate dielectric 37. The gate dielectric 37 and the gate conductor 36 of the gate structure 35 are present over the channel 50 of the semiconductor substrate 5. The gate conductor 36 may be a metal gate electrode. The gate conductor 36 may be composed of any conductive metal including, but not limited to, W, Ni, Ti, Mo, Ta, Cu, Pt, Ag, Au, Ru, Ir, Rh, and Re, and alloys that include at least one of the aforementioned conductive elemental metals. In one example, the gate conductor 36 is composed of TiN, TaN, Al, W or a combination thereof. In another embodiment, the gate conductor 36 may also be composed of a doped semiconductor material, such as n-type doped polysilicon.

Although not depicted in FIG. 1, the gate conductor 36 may be a multi-layered structure. For example, the gate conductor 36 may include a second conductive material atop a metal gate electrode. In one example, the second conductive material may be a doped semiconductor material, such as a doped silicon containing material, e.g., n-type doped polysilicon. When a combination of conductive elements is employed, an optional diffusion barrier material such as TaN or WN may be formed between the conductive materials.

The gate conductor 36 of the gate structure 35 is typically present on a gate dielectric 37. The gate dielectric 37 may be a dielectric material, such as $SiO_2$, or alternatively a high-k dielectric, such as oxides of Hf, Ta, Zr, Al or combinations thereof. In another embodiment, the gate dielectric 37 is comprised of an oxide, such as $ZrO_2$, $Ta_2O_5$ or $Al_2O_3$. In one embodiment, the gate dielectric 37 has a thickness ranging from 1 nm to 10 nm. In another embodiment, the gate dielectric 37 has a thickness ranging from 1.0 nm to 2.0 nm.

A gate sidewall spacer 38 may be in direct contact with the sidewalls of the gate structure 35. The gate sidewall spacer 38 typically has a width ranging from 2.0 nm to 15.0 nm, as measured from the sidewall of the gate structure 35. The gate sidewall spacer 38 may be composed of a dielectric, such as a nitride, oxide, oxynitride, or a combination thereof. In one example, the gate sidewall spacer 38 is composed of silicon nitride ($Si_3N_4$).

Still referring to FIG. 1, a source region 40 and a drain region 45 may be on opposing sides of the channel 50. The conductivity-type of the source region 40 and the drain region 45 determines the conductivity of the semiconductor device 100. Conductivity-type denotes whether the source region 40 and the drain region 45 have been doped with a p-type or n-type dopant. As used herein, "p-type" refers to the addition of impurities to an intrinsic semiconductor that creates deficiencies of valence electrons. In a silicon-containing substrate, examples of p-type dopants, i.e., impurities, include but are not limited to boron, aluminum, gallium and indium. As used herein, "n-type" refers to the addition of impurities that contributes free electrons to an intrinsic semiconductor. In a silicon containing substrate, examples of n-type dopants, i.e., impurities, include but are not limited to, antimony, arsenic and phosphorous.

The dopant may be introduced by ion implantation or may be introduced to the semiconductor substrate 5 in situ. In situ means that the dopant is introduced during the process sequence that forms the material layers that provide the semiconductor substrate 5. In one embodiment, in which the source region 40 and the drain region 45 are implanted with arsenic or phosphorus for an n-type semiconductor device, such as an n-type field effect transistor (nFET), the dopant concentration of the dopant region may range from $1\times10^{18}$ atoms/$cm^3$ to $5\times10^{21}$ atoms/$cm^3$. In another embodiment, in which the source region 40 and the drain region 45 are implanted with arsenic or phosphorus for an n-type semiconductor device, such as an n-type field effect transistor (nFET), the dopant concentration of the dopant region may range from $1\times10^{19}$ atoms/$cm^3$ to $1\times10^{21}$ atoms/$cm^3$. In another embodiment, in which the source region 40 and the drain region 45 is implanted with boron or $BF_2$ for a p-type semiconductor device, such as a p-type field effect transistor (pFET), the dopant concentration of the dopant region may range from $1\times10^{18}$ atoms/$cm^3$ to $5\times10^{21}$ atoms/$cm^3$. In another embodiment, in which the source region 40 and the drain region 45 is implanted with boron or $BF_2$ for a p-type semiconductor device, such as a p-type field effect transistor (pFET), the dopant concentration of the dopant region may range from $1\times10^{19}$ atoms/$cm^3$ to $1\times10^{21}$ atoms/$cm^3$.

Each of the source region 40 and the drain region 45 may include an extension dopant region and a deep dopant region (not shown). Typically, the dopant concentration of the extension dopant region having p-type dopant ranges from $5\times10^{19}$ atoms/$cm^3$ to $5\times10^{20}$ atoms/$cm^3$. In another embodiment, the extension dopant region having p-type dopant ranges from $7\times10^{19}$ atoms/$cm^3$ to $2\times10^{20}$ atoms/$cm^3$. Typically, the dopant concentration of the extension dopant region having n-type conductivity ranges from $5\times10^{19}$ atoms/$cm^3$ to $5\times10^{20}$ atoms/$cm^3$. In another embodiment, the extension dopant region having n-type conductivity ranges from $7\times10^{19}$ atoms/$cm^3$ to $2\times10^{20}$ atoms/$cm^3$. The deep dopant regions typically have the same conductivity dopant that may be present in greater concentration at greater depths into the semiconductor substrate 5 than the extension dopant region.

An interlevel dielectric layer 10 may be formed atop the semiconductor substrate 5. The interlevel dielectric layer 10 may be composed of any dielectric material including, but not limited to, oxides, nitrides, oxynitrides, and combinations thereof. In one example, the interlevel dielectric layer 10 is composed of silicon nitride. The interlevel dielectric layer 10 may also be composed of silicon oxide ($SiO_2$). Other examples of materials that are suitable for the interlevel dielectric layer 10 include silicon containing dielectric materials, such as $Si_3N_4$, $SiO_xN_y$, SiC, SiCO, SiCOH, and SiCH compounds, the above-mentioned silicon containing materials with some or all of the Si replaced by Ge, carbon-doped oxides, inorganic oxides, inorganic polymers, hybrid polymers, organic polymers such as polyamides or SiLK™, other carbon containing materials, organo-inorganic materials such as spin-on glasses and silsesquioxane-based materials, and diamond-like carbon (DLC, also known as amorphous hydrogenated carbon, α-C:H). Additional choices for the dielectric layer 10 include any of the aforementioned materials in porous form, or in a form that changes during processing to or from being porous and/or permeable to being non-porous and/or non-permeable. The interlevel dielectric layer 10 may have a thickness ranging from 5 nm to 40 nm. In another embodiment, the interlevel dielectric layer 10 has a thickness ranging from 10 nm to 20 nm.

In one embodiment, a planarization stop layer 11 may be present on an upper surface of the interlevel dielectric layer 10 and on an upper surface of the gate structure 35. The planarization stop layer 11 may have a thickness ranging from 5 nm to 40 nm. In another embodiment, the planarization stop layer 11 has a thickness ranging from 10 nm to 20 nm. The planarization stop layer 11 is a nitride or oxynitride material. In one example, the planarization stop layer 11 is composed of silicon nitride ($Si_3N_4$).

A interconnect 55 is present in the openings 15 to the source region 40 and the drain region 45 through the interlevel dielectric layer 10 and the planarization stop layer 11. The openings 15 may each have a width W1 ranging from 10 nm to 60 nm. In another embodiment, the opening 15 may have a width W1 ranging from 20 nm to 40 nm.

The interconnect 55 may be composed of any electrically conductive material. "Electrically conductive" as used through the present disclosure means a material typically having a room temperature conductivity of greater than $10^{-8}$ $(\Omega\text{-m})^{-1}$. Examples of materials that are suitable for the interconnect 55 include metals and doped semiconductors. For example, in one embodiment, the interconnect 55 may be composed of tungsten (W). Other metals that are suitable for the interconnect 55 include, but are not limited to, copper (Cu), titanium (Ti), tantalum (Ta), nickel (Ni), cobalt (Co), silver (Ag), aluminum (Al), platinum (Pt), gold (Au) and alloys thereof.

The interconnect 55 is separated from the sidewall S1 of the opening 15 by at least one dielectric sidewall spacer 25. In one embodiment, the at least one dielectric sidewall spacer 25 is present in direct contact with the interlevel dielectric layer 10 that provides the sidewall S1 of the opening 15 to the source and drain regions 40, 45. In some embodiments, the opening 15 to the source and drain regions 40, 45 is a trench. In other embodiments, the opening 15 to the source and drain region 40, 45 is a via. The at least one dielectric sidewall spacer 25 may be composed of any dielectric material. Some examples of dielectric materials that are suitable for the at least one dielectric sidewall spacer 25 include oxide, nitride, or oxynitride materials. One example of an oxide that is suitable for the at least one dielectric sidewall spacer 25 is silicon oxide ($SiO_2$). One example, of a nitride that is suitable for the at least one dielectric sidewall spacer 25 is silicon nitride ($Si_3N_4$). In the embodiment depicted in FIG. 1, a single dielectric sidewall spacer 25 is present in direct contact with the sidewall S1 of the opening 15 to the source and drain regions 40, 45. The at least one dielectric sidewall spacer 25 may have a width W2 that ranges from 2 nm to 20 nm. In another embodiment, the at least one dielectric sidewall spacer 25 may have a width W2 that ranges from 4 nm to 10 nm. Although the at least one dielectric sidewall spacer 25 is depicted in FIG. 1 as being composed of a single dielectric material layer, the at least one dielectric sidewall spacer 25 may be composed of any number of dielectric material layers.

In one embodiment, electrical contact between the interconnect 55 and the source region 40 and the drain region 45 of the semiconductor substrate 5 is provided by a metal semiconductor alloy contact 20. Electrical contact means that the interconnect 55 and the source region 40 and the drain region 45 of the semiconductor substrate 5 are in electrical communication through the interfacing metal semiconductor alloy contact 20, wherein the interface between the metal semiconductor alloy contact 20 and each of the interconnect 55 and the source and drain regions 40, 45 are electrically conductive with low resistance. In one embodiment, the width W4, i.e., final width, of the openings 15 ranges from 5 nm to 55 nm. In another embodiment, the width W4 of the openings 15 ranges from 10 nm to 30 nm.

The metal semiconductor alloy contact 20 may be composed of a silicide or germicide. In one example, the metal semiconductor alloy contact 20 may be composed of nickel silicide ($NiSi_x$). Other examples of compositions for the metal semiconductor alloy contact 20 may include, nickel platinum silicide ($NiPt_ySi_x$), cobalt silicide ($CoSi_x$), tantalum silicide ($TaSi_x$), titanium silicide ($TiSi_x$) and combinations thereof.

In one embodiment, the interconnect 55 is centrally positioned on the upper surface of the metal semiconductor alloy contact 20. By centrally positioned it is meant that the center of the width of the interconnect 55 is substantially aligned to the center of the width of the metal semiconductor alloy contact 20. In one embodiment, the interconnect 55 and the metal semiconductor alloy contact 20 are positioned to provide an inverted "T" geometry.

In one embodiment, the metal semiconductor alloy contact 20 is formed in the trench or via that is produced by the opening 15. Therefore, the outside edge E1 of the metal semiconductor alloy contact 20 is substantially aligned with the sidewall S1 of the opening 15 through the interlevel dielectric layer 10. Further, because the metal semiconductor alloy contact 20 is substantially aligned to the sidewall S1 of the opening 15 that is through the interlevel dielectric layer 10, and the metal semiconductor alloy contact 20 is contained within the portion of the semiconductor substrate 5 that is exposed by the opening 15, a portion of the metal semiconductor alloy contact 20 is present under the at least one dielectric sidewall spacer 25. The portion of the metal semiconductor alloy contact 20 that is present under the at least one dielectric sidewall spacer 25 has a width that is equal to the width W2 of the at least one dielectric sidewall spacer 25.

The metal semiconductor alloy contact 20 may have a width W3 ranging from 10 nm to 70 nm. In another embodiment, the metal semiconductor alloy contact 20 has a width W3 that ranges from 20 nm to 50 nm. In one embodiment, the metal semiconductor alloy contact 20 extends into the source region 40 and the drain region 45 of the semiconductor substrate 5 by a depth D1 that may be as great as 30 nm, as measured from the upper surface of the semiconductor substrate 5. In another embodiment, the metal semiconductor alloy contact 20 extends into the source region 40 and the drain region 45 of the semiconductor substrate 5 by a depth D1 that may be as great as 15 nm, as measured from the upper surface of the semiconductor substrate 5. The upper surface of the metal semiconductor alloy contact 20 extends to a height H1 ranging that may be as great as 30 nm, as measured from the upper surface of the semiconductor substrate 5.

The edge E1 of the metal semiconductor alloy contacts 20 is typically separated from the sidewall S2 of the gate structure 35 by a dimension W5 that ranges from 5 nm to 30 nm. In another embodiment, the inside edge E1 of the metal semiconductor alloy contacts 20 is typically separated from the sidewall S2 of the gate structure 35 by a dimension W5 that ranges from 15 nm to 25 nm. The inside sidewalls S3 of the interconnect 55 are typically separated from the sidewall S2 of the gate structure 35 by a dimension W6 that ranges from 10 nm to 35 nm. In another embodiment, the inside sidewalls S3 of the interconnect 55 are separated from the sidewall S2 of the gate structure 35 by a dimension W6 that ranges from 20 nm to 30 nm.

Although only one semiconductor device 100 is depicted in FIG. 1, any number of semiconductor devices 100 may be formed on the semiconductor substrate 5. The spacing the gate structures 35 of adjacent semiconductor devices dictates the pitch. The term "pitch" means the center-to-center distance between two repeating elements of a circuit including semiconductor devices. In one embodiment, the pitch may be measured from the center of the upper surface of a first gate structure to the center of the upper surface of an adjacent gate structure. The actual dimensions for the pitch may depend upon the technology node. In one example, the gate pitch is selected to correspond to the 20 nm technology node. In one example, the pitch ranges from 80 nm to 100 nm.

In comparison to semiconductor devices of the same scale and opening to the source and drain region dimensions that include the interconnect filing the entirety of spacerless openings, the contact structure including the at least one dielectric sidewall spacer 25 described herein reduces the incidence of shorting between the gate structure 35 and the interconnect 55. Further, the proximity of the edge E1 of the metal semiconductor alloy contact 20 to the sidewall S2 of the gate structure 35 provides a low resistance contact to the source region 40 and the drain region 45 of the semiconductor device 100.

Figure 2A:
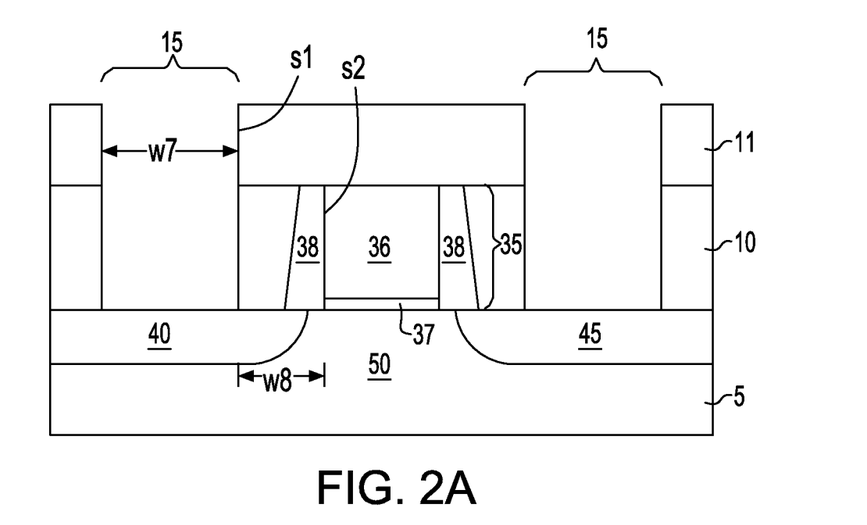
FIG. 2A is a side cross-sectional view of an initial structure used in a method to provide the metal semiconductor alloy contacts that are depicted in FIG. 1, wherein the initial structure includes an interlevel dielectric layer that is present over a semiconductor device having openings to the source region and the drain region of the semiconductor device, in accordance with the present disclosure.
Figure 2B:
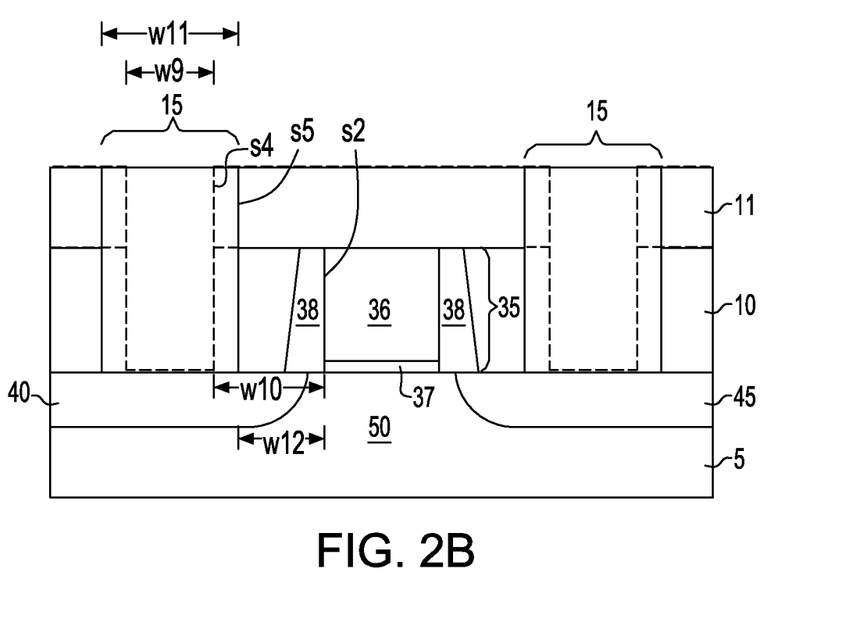
FIG. 2B is a side cross-sectional view of one embodiment of an initial structure used in a method to provide the metal semiconductor alloy contacts that are depicted in FIG. 1, wherein the initial structure includes an interlevel dielectric layer that is present over the semiconductor device having openings to the source region and the drain region of the semiconductor device, wherein the width of the openings is increased by a dry or wet etch process, in accordance with the present disclosure.

Some embodiments of forming the structure depicted in FIG. 1 are now described with reference to FIGS. 2A-7. FIG. 2A depicts one embodiment of an initial structure used in a method to provide the metal semiconductor alloy contacts 20 that are depicted in FIG. 1. In the embodiment that is depicted in FIG. 2A, the openings 15 to the source region 45 and the drain region 45 are patterned and etched to their final width, wherein the originally patterned and etched openings 15 position the subsequently formed metal semiconductor alloy contacts 20 into close proximity to the gate structure 35. FIG. 2B depicts another embodiment, in which following patterning and etching of the openings 15, an isotropic etch or clean process increases the width of the openings 15 to their final width.

Referring to FIGS. 2A and 2B, the initial structure may include a semiconductor substrate 5, a gate structure 35, source region 40, drain region 45, and an interlevel dielectric layer 10, wherein an opening 15 is present through the interlevel dielectric layer 10 to each of the source region 40 and the drain region 45. In some embodiments, the opening 15 may have the geometry of a trench or a via. The gate structure 35 that is depicted in FIGS. 2A and 2B may be formed using replacement gate technology. In replacement gate technology, a sacrificial material dictates the geometry and location of the later formed gate structure 35. The sacrificial material is used to form the doped regions of the semiconductor substrate 5, such as the source region 40 and the drain region 45. The sacrificial material is then replaced with the gate structure 35. By employing a sacrificial material, the thermal budget that is applied to the gate structure 35 may be reduced.

In one embodiment, a method sequence for forming the structure depicted in FIGS. 2A and 2B begins with forming a sacrificial gate structure (not shown), i.e., a sacrificial material having the geometry of the subsequently formed gate structure 35, on a semiconductor substrate 5. The semiconductor substrate 5 has been described above with reference to FIG. 1. The sacrificial gate structure may be composed of any material that can be etched selectively to the underlying upper surface of the semiconductor substrate 5. In one embodiment, the sacrificial gate structure may be composed of a silicon-containing material, such as polysilicon. Although, the sacrificial gate structure is typically composed of a semiconductor material, the sacrificial gate structure may also be composed of a dielectric material, such as an oxide, nitride or oxynitride material, or amorphous carbon.

The sacrificial material may be patterned and etched to provide the sacrificial gate structure. Specifically, and in one example, a pattern is produced by applying a photoresist to the surface to be etched, exposing the photoresist to a pattern of radiation, and then developing the pattern into the photoresist utilizing a resist developer. Once the patterning of the photoresist is completed, the sections covered by the photoresist are protected, while the exposed regions are removed using a selective etching process that removes the unprotected regions. As used herein, the term "selective" in reference to a material removal process denotes that the rate of material removal for a first material is greater than the rate of removal for at least another material of the structure to which the material removal process is being applied.

In one embodiment, the etch process removes the exposed portions of the sacrificial material layer with an etch chemistry that is selective to the semiconductor substrate 5. In one another embodiment, the etch process that forms the sacrificial gate structure is an anisotropic etch. An anisotropic etch process is a material removal process in which the etch rate in the direction normal to the surface to be etched is greater than in the direction parallel to the surface to be etched. The anisotropic etch may include reactive-ion etching (RIE). Other examples of anisotropic etching that can be used at this point of the present disclosure include ion beam etching, plasma etching or laser ablation.

The gate sidewall spacer 38 is then formed adjacent to the sacrificial gate structure, i.e., in direct contact with the sidewall of the sacrificial gate structure. The composition and dimensions of the gate sidewall spacer 38 have been described above with reference to FIG. 1. In one embodiment, the gate sidewall spacer 38 may be formed by using a blanket layer deposition, such as chemical vapor deposition, and anisotropic etchback method.

The source region 40 and the drain region 45 may then be formed in portions of the semiconductor substrate 5 on opposing sides of the portion of the semiconductor substrate 5 that the sacrificial gate structure is present on. In one embodiment, the source region 40 and the drain region 45 are formed using an ion implantation process. More specifically, when forming a p-type extension region portion of the source region 40 and drain region 45 a typical dopant species is boron or $BF_2$. Boron may be implanted utilizing implant energies ranging from 0.2 keV to 3.0 keV with an implant dose ranging from $5 \times 10^{14}$ atoms/cm$^2$ to $5 \times 10^{15}$ atoms/cm$^2$. $BF_2$ may be implanted utilizing implant energies ranging from 1.0 keV to 15.0 keV and a dose ranging from $5 \times 10^{14}$ atoms/cm$^2$ to $5 \times 10^{15}$ atoms/cm$^2$. A typical implant for the n-type extension dopant region of the source region 40 and the drain region 45 is arsenic. The n-type extension dopant region of the source region 40 and the drain region 45 can be implanted with arsenic using implant energies ranging from 1.0 keV to 10.0 keV with a dose ranging from $5 \times 10^{14}$ atoms/cm$^2$ to $5 \times 10^{15}$ atoms/cm$^2$. The deep dopant region (not shown) of the source region 40 and the drain region 45 may have the same conductivity as the extension dopant region, but may be implanted with a higher dose and implant energy. The source region 40 and drain region 45 may further include halo implant regions (not shown). Halo implant regions typically have the opposite conductivity as the extension dopant region and may be formed using an angled ion implantation.

Referring to FIGS. 2A and 2B, the interlevel dielectric layer 10 is deposited atop the semiconductor substrate 5. The composition of the interlevel dielectric layer 10 has been described above with reference to FIG. 1. The interlevel dielectric layer 10 may be deposited using chemical vapor deposition (CVD). Chemical vapor deposition (CVD) is a deposition process in which a deposited species is formed as a result of chemical reaction between gaseous reactants at greater than room temperature (25° C. to 900° C.); wherein solid product of the reaction is deposited on the surface on which a film, coating, or layer of the solid product is to be formed. Variations of CVD processes include but are not limited to Atmospheric Pressure CVD (APCVD), Low Pressure CVD (LPCVD) and Plasma Enhanced CVD (EPCVD), Metal-Organic CVD (MOCVD) and others. In addition to chemical vapor deposition (CVD), the interlevel dielectric layer 10 may also be formed using spinning from solution, spraying from solution, and evaporation.

Following deposition, the interlevel dielectric layer 10 is planarized until the upper surface of the sacrificial gate structure is exposed. "Planarization" is a material removal process that employs at least mechanical forces, such as frictional media, to produce a planar surface. In one embodiment, the planarization process includes chemical mechanical polishing (CMP) or grinding. Chemical mechanical planarization (CMP) is a material removal process using both chemical reactions and mechanical forces to remove material and planarize a surface.

The sacrificial gate structure is removed to provide an opening to an exposed portion of the semiconductor substrate 5. The sacrificial gate structure is typically removed using a selective etch process that removes the sacrificial gate structure selective to the semiconductor substrate 5, the gate sidewall spacer 38 and the interlevel dielectric layer. The etch may be an isotropic etch or an anisotropic etch. The anisotropic etch may include reactive-ion etching (RIE). Other examples of anisotropic etching that can be used at this point of the present disclosure include ion beam etching, plasma etching or laser ablation. In comparison to anisotropic etching, isotropic etching is non-directional. One example of an isotropic etch is a wet chemical etch. In one embodiment, in which the sacrificial gate structure is composed of polysilicon, the upper surface of the semiconductor substrate 5 is a silicon-containing material, and the gate sidewall spacer 38 is composed of nitride ($Si_3N_4$), the wet etch chemistry for removing the sacrificial gate structure may be composed of DHF and hot $NH_3$, or TetraMethyl Ammonium Hydroxide (TMAH).

A functional gate structure 35 is formed in the opening in the interlevel dielectric layer 10 to the semiconductor substrate 5. In one embodiment, a gate dielectric 37 is formed on the exposed upper surface of the semiconductor substrate 5. The gate dielectric 37 may be composed of a high-k dielectric material. The term "high-k" denotes a material having a dielectric constant that is greater than the dielectric constant of silicon oxide ($SiO_2$) at room temperature, i.e., 20° C. to 25° C. In one embodiment, the high-k dielectric that provides the gate dielectric 37 is comprised of a material having a dielectric constant that is greater than 4.0, e.g., 4.1. In another embodiment, the high-k gate dielectric that provides the gate dielectric 37 is comprised of a material having a dielectric constant greater than 7.0. In yet another embodiment, the high-k gate dielectric that provides the gate dielectric 37 is comprised of a material having a dielectric constant ranging from greater than 4.0 to 30. The dielectric constants mentioned herein are relative to a vacuum at room temperature, i.e., 20° C. to 25° C.

In one example, a high-k gate dielectric is provided by hafnium oxide ($HfO_2$). Other examples of suitable high-k dielectric materials for the gate dielectric 37 include hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, lead zinc niobate and combinations thereof.

In one embodiment, the gate dielectric 37 is formed using a deposition process, such as chemical vapor deposition (CVD). In another embodiment, the gate dielectric 37 may be formed by a thermal growth process such as, for example, oxidation, nitridation or oxynitridation. The gate dielectric 37 may have a thickness ranging from 1 nm to 5 nm. In another embodiment, the gate dielectric 37 has a thickness ranging from 1 nm to 2.5 nm. In yet another example, the gate dielectric 37 has a thickness that ranges from 15 Å to 20 Å.

A gate conductor 36 is formed on the gate dielectric 37 filling the opening that is formed by removing the sacrificial gate structure. In one embodiment, the gate conductor 36 is composed of a metal, such as a work function metal layer. In one embodiment, in which the semiconductor device 100 is an n-type semiconductor device, the work function metal layer that provides the gate conductor 36 is an n-type work function metal layer. As used herein, an "n-type work function metal layer" is a metal layer that effectuates an n-type threshold voltage shift. "N-type threshold voltage shift" as used herein means a shift in the Fermi energy of an n-type semiconductor device towards a conduction band of silicon in a silicon-containing substrate of the n-type semiconductor device. The "conduction band" is the lowest lying electron energy band of the doped material that is not completely filled with electrons. In one embodiment, the work function of the n-type work function metal layer ranges from 4.1 eV to 4.3 eV.

In one embodiment, the n-type work function metal layer is composed of at least one of TiAl, TaN, TiN, HfN, HfSi, or combinations thereof. The n-type work function metal layer can be deposited using chemical vapor deposition (CVD), atomic layer deposition (ALD), sputtering or plating. In one embodiment, the n-type work function metal layer is composed of titanium aluminum (TiAl) and is deposited using sputtering. As used herein, "sputtering" means a method for depositing a film of metallic material, in which a target of the desired material, i.e., source, is bombarded with particles, e.g., ions, which knock atoms from the target, where the dislodged target material deposits on a deposition surface. Examples of sputtering apparatus that may be suitable for depositing the n-type work function metal layer include DC diode type systems, radio frequency (RF) sputtering, magnetron sputtering, and ionized metal plasma (IMP) sputtering. In one example, an n-type work function metal layer composed of TiN is sputtered from a solid titanium target, in which the nitrogen content of the metal nitride layer is introduced by a nitrogen gas. In another example, an n-type work function metal layer composed of TiN is sputtered from a solid target comprised of titanium and nitrogen. In addition to physical vapor deposition (PVD) techniques, the n-type work function metal layer may also be formed using chemical vapor deposition (CVD) and atomic layer deposition (ALD).

In another embodiment, the work function metal layer may be a p-type work function metal layer. As used herein, a "p-type work function metal layer" is a metal layer that effectuates a p-type threshold voltage shift. In one embodiment, the work function of the p-type work function metal layer ranges from 4.9 eV to 5.2 eV. As used herein, "threshold voltage" is the lowest attainable gate voltage that will turn on a semiconductor device 110, e.g., transistor, by making the channel of the device conductive. The term "p-type threshold voltage shift" as used herein means a shift in the Fermi energy of a p-type semiconductor device towards a valence band of silicon in the silicon containing substrate of the p-type semiconductor device. A "valence band" is the highest range of electron energies where electrons are normally present at absolute zero.

In one embodiment, the p-type work function metal layer may be composed of titanium and their nitrided/carbide. In one embodiment, the p-type work function metal layer is composed of titanium nitride (TiN). The p-type work function metal layer may also be composed of TiAlN, Ru, Pt, Mo, Co and alloys and combinations thereof. In one embodiment, the p-type work function metal layer comprising titanium nitride (TiN) may be deposited by a physical vapor deposition (PVD) method, such as sputtering. Examples of sputtering apparatus that may be suitable for depositing the p-type work function metal layer include DC diode type systems, radio frequency (RF) sputtering, magnetron sputtering, and ionized metal plasma (IMP) sputtering. In addition to physical vapor deposition (PVD) techniques, the p-type work function metal layer may also be formed using chemical vapor deposition (CVD) and atomic layer deposition (ALD).

In another embodiment, the gate conductor 36 is provided by a doped semiconductor, such as n-type doped polysilicon. In one embodiment, the gate conductor 36 is planarized until the upper surface of the gate conductor 36 is coplanar with the upper surface of the interlevel dielectric 10. In some examples, the gate conductor 36 may be planarized using chemical mechanical planarization (CMP).

A planarization stop layer 11 may be formed atop the upper surface of the interlevel dielectric layer 10 and the gate conductor 36. In one example, the planarization stop layer 11 is composed of silicon nitride ($Si_3N_4$). The planarization stop layer 11 may be deposited using chemical vapor deposition (CVD). Variations of CVD processes include but are not limited to Atmospheric Pressure CVD (APCVD), Low Pressure CVD (LPCVD) and Plasma Enhanced CVD (EPCVD), Metal-Organic CVD (MOCVD) and others. In addition to chemical vapor deposition (CVD), the planarization stop layer 11 may also be formed using spinning from solution, spraying from solution, and evaporation.

Referring to FIGS. 2A and 2B, openings 15 may be formed through the planarization stop layer 11 and the interlevel dielectric layer 10 to expose an upper surface of the semiconductor substrate 5 in which the source region 40 and the drain region 45 are present. In some embodiments, the openings 15 may have the geometry of trenches, vias or a combination thereof. The openings 15 may be formed using photolithography and etch processes. For example, a photoresist etch mask can be produced by applying a photoresist layer to the upper surface of the planarization stop layer 11, exposing the photoresist layer to a pattern of radiation, and then developing the pattern into the photoresist layer utilizing a resist developer. The photoresist etch mask may be positioned so that portions of the planarization stop layer 11 and the interlevel dielectric layer 10 are not protected by the photoresist etch mask in order to provide the openings 15.

The exposed portion of the planarization stop layer 11 and the interlevel dielectric layer 10 is then removed by a selective etch. The selective etch may be an anisotropic etch or an isotropic etch. One example of an anisotropic etch that is suitable for forming the openings 15 15 is reactive ion etch (RIE). Other examples of anisotropic etching that can be used at this point of the present disclosure include ion beam etching, plasma etching or laser ablation.

In one embodiment, the openings 15 are first formed in the planarization stop layer 11 with an etch that terminates on the interlevel dielectric 10. Thereafter, the openings 15 are then extended through the interlevel dielectric layer 10 to the source region 40 and the drain region 45. In one example, when the planarization stop layer 11 is composed of silicon oxide or silicon nitride, and the upper surface of the semiconductor substrate 5 is composed of silicon, the etch chemistry for forming the openings 15 to the source region 40 and drain region 45 is composed of fluorine based chemical, such as $CF_4$, $CClF_2$, $SF_6$ and combinations thereof.

Referring to FIG. 2A, in one embodiment, the width W7 of the opening 15 to the source region 40 and the drain region 45 ranges from 10 nm to 60 nm, in which the sidewall S1 of the opening 15 is separated from the sidewall of the gate structure S2 by a dimension W8 that ranges from 5 nm to 30 nm. In another embodiment, the width W7 of the opening 15 ranges from 20 nm to 40 nm, in which the sidewall S1 of the opening 15 is separated from the sidewall of the gate structure S2 by a dimension W8 that ranges from 15 nm to 25 nm. In the embodiment depicted in FIG. 2A, the width W7 of the openings 15 is patterned and etched to provide the final width of the openings 15, and is therefore equal to the width W1 of the openings 15 depicted in FIG. 1.

Referring to FIG. 2B, in another embodiment, the openings 15 are initially patterned and etched to be further away from the gate structure 35 than in the previously described embodiment. The sidewalls S4 of the openings 15 prior to widening by isotropic etch or cleaning process are depicted in FIG. 2B by the broken line. The sidewalls S5 of the openings 15 after widening with the isotropic etch or cleaning process are depicted in FIG. 2B with a solid line.

In one embodiment, the initial width W9 of the opening 15 post lithographic patterning and anisotropic etching is intentionally made smaller (as depicted as W9 in FIG. 2B, which is smaller than W7 in FIG. 2A), in order to compensate for the sidewall material erosion introduced during the preclean processes used to form the metal semiconductor alloy contact 20. For example, when the metal semiconductor alloy contact 20 is a silicide, a wet cleaning process or a dry etch, or a combination of both, is applied prior to metal deposition and full silicidation.

By increasing the width of the openings 15, the distance separating the openings 15 from the sidewall S2 of the gate structure 35 is decreased. In accordance with the embodiments that employ a subsequent trench widening step, the initial width W9 of the openings 15 ranges from 5 nm to 55 nm, in which the sidewall S4 of the opening 15 is separated from the sidewall S2 of the gate structure 35 by a dimension W10 that ranges from 10 nm to 35 nm. In another embodiment that employs a subsequent trench widening step, the initial width W9 of the openings 15 ranges from 10 nm to 30 nm, in which the sidewall S4 of the opening 15 is separated from the sidewall S2 of the gate structure 35 by a dimension W10 that ranges from 20 nm to 30 nm.

FIG. 2B depicts one embodiment of widening the openings 15 prior to forming the metal semiconductor alloy contacts. In one embodiment, the width of the openings 15 is widened by a dry etch process, a wet cleaning or a combination thereof. The width of the openings 15 may be increased by a dimension that ranges from 2 nm to 30 nm. In another embodiment, the openings 15 may be increased by a dimension that ranges from 4 nm to 15 nm. The isotropic etch process may be a dry etch. In one embodiment, the dry etch process that widens the openings 15 is composed of $NH_3/NF_3$ chemistry. In the embodiment, in which the openings 15 are widened using a wet cleaning process, the cleaning process may include diluted HF (DHF) or buffered HF (BHF), or HFEG.

In one embodiment, the final width W11 of the opening 15 after widening ranges from 10 nm to 60 nm, in which the sidewall S5 of the opening 15 is separated from the sidewall S2 of the gate structure 35 by a dimension W12 that ranges from 5 nm to 30 nm. In another embodiment, the width W11 of the opening 15 after widening ranges from 20 nm to 40 nm, in which the sidewall S5 of the opening 15 is separated from the sidewall S2 of the gate structure 35 by a dimension W12 that ranges from 15 nm to 25 nm. The final width W11 of the opening 15 that is depicted in FIG. 2B may be equal to the width W7 of the via opening 15 that is depicted in FIG. 2A. Further, the final sidewall S5 of the opening 15 that is depicted in FIG. 2B may be equivalent in geometry and location to the sidewall S1 of the opening 15 that is depicted in FIG. 2A.

Figure 3:
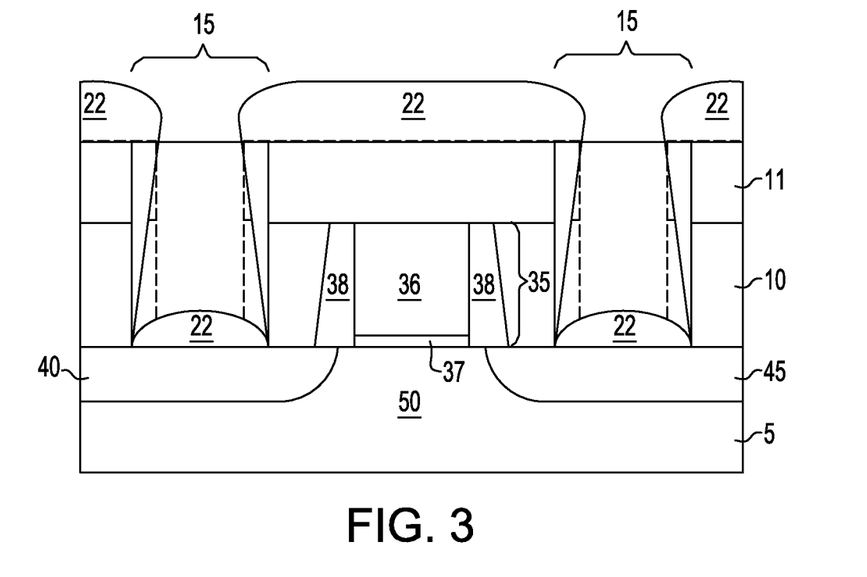
FIG. 3 is a side cross-sectional view of depositing a metal-containing layer within the trench on the exposed portion of the semiconductor substrate, in accordance with one embodiment of the present disclosure.
Figure 4:
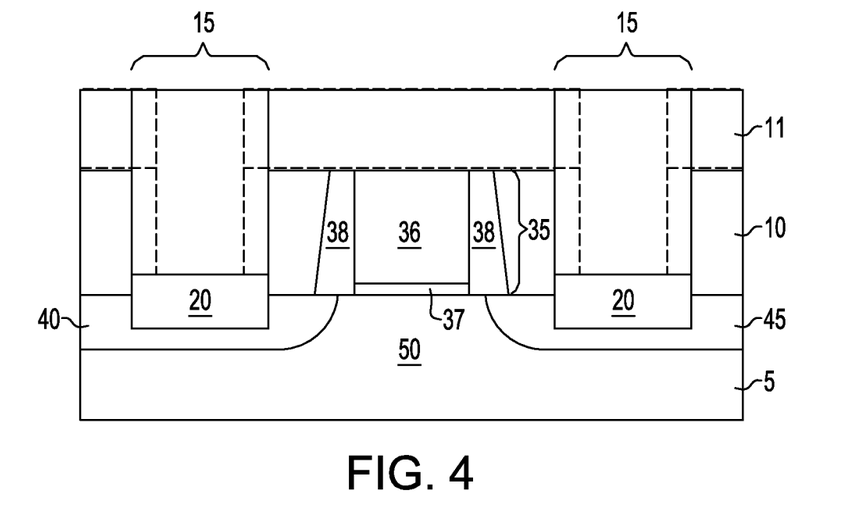
FIG. 4 is a side cross-sectional view of converting the metal-containing layer into a metal semiconductor alloy contact, in accordance with one embodiment of the present disclosure.

FIGS. 3 and 4 depict one embodiment of forming a metal semiconductor alloy contact 20 on the portion of the semiconductor substrate 5 that is exposed by the openings 15. In one embodiment, forming the metal semiconductor alloy contact 20 includes depositing a metal-containing layer 22 on the exposed portion of the semiconductor substrate 5, annealing the metal-containing layer 22 to convert at least a portion of the metal-containing layer 22 and the exposed portion of the semiconductor substrate 5 into a metal semiconductor alloy contact 20, and removing the non-reacted portion of the metal-containing layer 22 by selective strip process.

FIG. 3 depicts one embodiment of forming a metal containing layer 22 on at least the exposed surface of the semiconductor layer that includes the source region 40 and the drain region 45. The metal containing layer 22 may be deposited on the upper surface of the planarization stop layer 11, the sidewalls of the opening 15, and the base of the trench provided by the opening 15 that includes the exposed surface of the semiconductor substrate 5.

The metal containing layer 22 may be deposited using physical vapor deposition (PVD) methods or chemical vapor deposition (CVD) methods. Examples of physical vapor deposition (PVD) that are suitable for forming the metal containing material 22 include sputtering and plating. As used herein, "sputtering" means a method of depositing a film of material on a semiconductor surface. A target of the desired material, i.e., source, is bombarded with particles, e.g., ions, which knock atoms from the target, and the dislodged target material deposits on the semiconductor surface. Examples of sputtering apparatuses include DC diode type systems, radio frequency (RF) sputtering, magnetron sputtering, and ionized metal plasma (IMP) sputtering.

In one example, the metal containing layer 22 may be composed of nickel or nickel platinum alloy. The metal containing layer 22 may also include at least one of nickel (Ni), cobalt, (Co), tungsten (W), titanium (Ti), tantalum (Ta), aluminum (Al), platinum (Pt) and combinations thereof. In one example, the metal containing layer is a nickel (Ni) and platinum (Pt) alloy, wherein the nickel (Ni) content is greater than or equal to 90 at. % and the platinum (Pt) content is less than or equal to 10 at. %. The metal containing layer 22 may have a thickness ranging from 5 nm to 20 nm. In another embodiment, the metal containing layer 22 may have a thickness ranging from 6 nm to 15 nm.

FIG. 4 depicts one embodiment of converting the metal containing layer 22 and an underlying portion of the semiconductor substrate 5 into a metal semiconductor alloy contact 20 that extends into the source region 40 and the drain region 45. Following deposition of the metal containing layer 22, the structure is subjected to an annealing step including, but not limited to, rapid thermal annealing. During annealing, the deposited metal containing layer 22 reacts with the semiconductor substrate 5 forming a metal semiconductor alloy contact 20, such as a metal silicide. In one embodiment, the thermal anneal is completed at a temperature ranging from 350° C. to 600° C. for a time period ranging from 1 second to 90 seconds. Following thermal anneal, the non-reacted portion of the metal containing layer 22 is removed. The non-reacted portion of the metal containing layer 22 may be removed by an etch process that is selective to the metal semiconductor alloy contact 20. In another embodiment, the metal semiconductor alloy contact 20 is formed by multiple steps of anneal and strip (e.g. a first anneal at low temperature, followed by a first strip, then a second anneal at high temperature, followed by a second strip). The composition and the geometry of the metal semiconductor alloy contact 20 has been described above with reference to FIG. 1.

Figure 5:
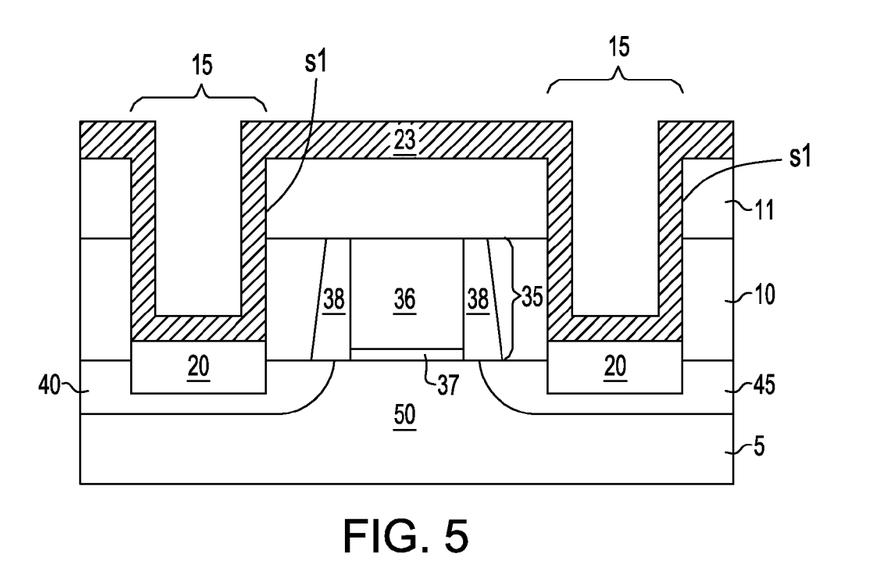
FIG. 5 is a side cross-sectional view depicting forming a conformal dielectric layer on the sidewalls of the opening to the source and drain region, and on the metal semiconductor alloy contact at the base of the opening to the source and drain region, in accordance with one embodiment of the present disclosure.
Figure 6:
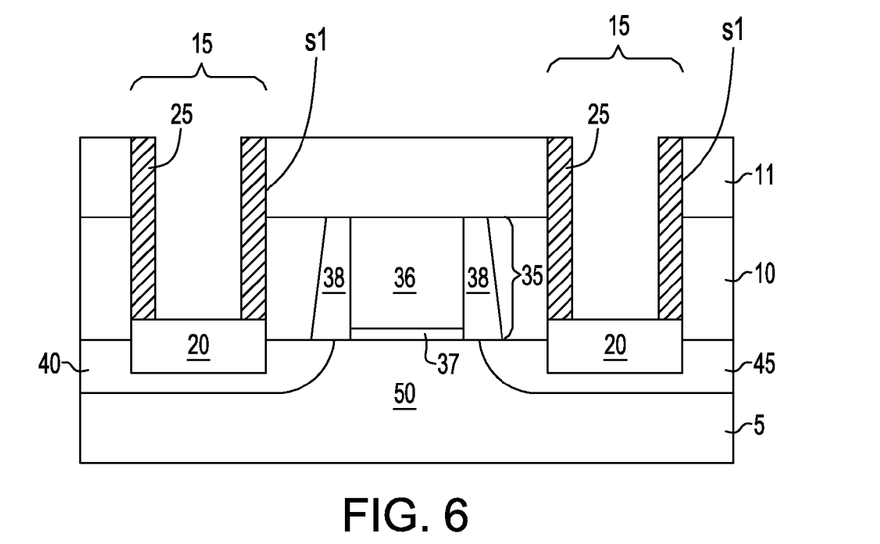
FIG. 6 is a side cross-sectional view depicting removing a horizontal portion of the conformal dielectric layer that is present between a vertical portion of the conformal dielectric layer that is present on the sidewalls of the openings to the source and drain regions to provide at least one dielectric sidewall spacer on the sidewall of the openings, in accordance with one embodiment of the present disclosure.

FIGS. 5 and 6 depict one embodiment of forming at least one dielectric sidewall spacer 25 on sidewalls S1 of the openings 15 to the source region 40 and the drain region 45. The at least one dielectric sidewall spacer 25 is present overlying the portion of the metal semiconductor alloy contact 20 that is adjacent to the sidewall S1 of the opening 15. The dimensions of the at least one dielectric sidewall spacer 25 are described above with reference to FIG. 1. In one embodiment, forming the at least one dielectric sidewall spacer 25 on the sidewalls S1 of the opening 15 includes depositing a conformal dielectric layer 23 on the sidewalls S1 of the opening 15 and on the metal semiconductor alloy contact 20, and removing a horizontal portion of the conformal dielectric layer 23 that is present on the sidewalls S1 of the opening 15 to the source region 40 and the drain region 45 to provide the at least one dielectric sidewall spacer 25.

FIG. 5 depicts one embodiment of depositing a conformal dielectric layer 23 on the sidewalls S1 of the opening 15 and on the metal semiconductor alloy contact 20. The conformal dielectric layer 23 may also be formed on the upper surface of the planarization stop layer 11. In one embodiment, the conformal dielectric layer 23 is formed utilizing a deposition process, such as chemical vapor deposition (CVD), evaporation, spin-on coating, or chemical solution deposition. Chemical Vapor Deposition is a deposition process in which a deposited species is formed as a result of a chemical reaction between gaseous reactants at greater than room temperature (25° C. to 600° C.), wherein solid product of the reaction is deposited on the surface on which a film, coating, or layer of the solid product is to be formed. Variations of CVD processes include, but are not limited to, Atmospheric Pressure CVD (APCVD), Low Pressure CVD (LPCVD) Plasma Enhanced CVD (EPCVD), Metal-Organic CVD (MOCVD) and combinations thereof may also be employed. In another embodiment, a thermal growth process can be used, such as, for example, oxidation, nitridation and/or oxynitridation. The term "conformal layer" denotes a layer having a thickness that does not deviate from greater than or less than 20% of an average value for the thickness of the layer. In one embodiment, the conformal dielectric layer 23 may be comprised of an oxide, nitride, oxynitride or multilayers thereof. In one embodiment, the conformal dielectric layer 23 is silicon oxide. In one embodiment, the conformal dielectric layer 23 may have a thickness ranging from 2 nm to 20 nm.

FIG. 6 depicts one embodiment of removing a horizontal portion of the conformal dielectric layer 23 that is present on the sidewalls S1 of the opening 15 to provide the at least one dielectric sidewall spacer 25. The horizontal portions of the conformal dielectric layer 23 are removed using an anisotropic etch process. In one embodiment, the horizontal portions of the conformal dielectric layer 23 that are removed by the anisotropic etch include the portions of the conformal dielectric layer 23 that are present on the upper surface of the planarization stop layer 11, and the portion of the conformal dielectric layer 23 that is present at the base of the trench between the vertical portions of the conformal dielectric layer 23 that are present on the sidewalls S1 of the openings 15 to the source regions 40 and the drain regions 45.

The anisotropic etch that removes the horizontal portions of the conformal dielectric layer 23 may be selective to the metal semiconductor alloy contact 20 and the planarization stop layer 11. The anisotropic etch may include reactive-ion etching (RIE). Reactive ion etching (RIE) is a form of plasma etching in which during etching the surface to be etched is exposed to reactive gases in the presence of an RF field. During RIE the surface to be etched takes on a potential that accelerates the reactive species extracted from a plasma toward the surface, in which the chemical etching reaction is taking place in the direction normal to the surface. Other examples of anisotropic etching that can be used at this point of the present disclosure include ion beam etching, plasma etching or laser ablation. The remaining portion of the conformal dielectric layer 23 is present on the sidewall S1 of the opening 15, and may have an upper surface that is coplanar with the upper surface of the planarization stop layer 11.

Referring to FIG. 1, a interconnect 55 may be formed in direct contact with the metal semiconductor alloy contact 20, wherein the interconnect 55 is contained within the openings 15 to the source and drain regions 40, 45. The interconnect 55 may also be referred to as a metal stud, a metal via, or a metal fill that is present within a trench. Metal interconnects 55 are formed by depositing a conductive metal into the openings 15 to the source region 40 and the drain region 45 using a deposition process, such as physical vapor deposition (PVD). Examples of physical vapor deposition (PVD) that are suitable for forming the interconnect 55 include sputtering and plating. Examples of sputtering apparatuses suitable for forming the interconnect 55 include DC diode type systems, radio frequency (RF) sputtering, magnetron sputtering, and ionized metal plasma (IMP) sputtering. The interconnect 55 may also be formed using chemical vapor deposition (CVD). The interconnect 55 may be composed of a conductive metal, such as tungsten, copper, aluminum, silver, gold, and alloys thereof. In some embodiments, a Ti/TiN liner may be formed on the sidewalls and the base of the opening 15 to the source and drain regions 40, 45 prior to depositing a tungsten fill to form the interconnects 55.

While the claimed methods and structures has been particularly shown and described with respect to preferred embodiments thereof, it will be understood by those skilled in the art that the foregoing and other changes in form and details may be made therein without departing from the spirit and scope of the presently claimed methods and structures.

What is claimed is:

1. A method of forming a semiconductor device comprising:
   forming a gate structure on a channel portion of a semiconductor substrate, wherein a source region and a drain region are present on opposing sides of the channel portion of the semiconductor substrate;
   forming an interlevel dielectric layer over the gate structure;
   forming an opening to at least one of the source region and the drain region through the interlevel dielectric layer to an exposed surface of the semiconductor substrate containing at least one of the source region and the drain region, wherein said forming of the opening comprises forming an etch mask over the dielectric layer including initial openings having a first width, etching the interlevel dielectric layer with an anisotropic etch that is selective to the exposed portion of the semiconductor substrate, and increasing the width of the initial openings to a second width to provide the openings to at least one of the source region and the drain region;
   forming a metal semiconductor alloy contact on the exposed surface of the semiconductor substrate;
   forming at least one dielectric sidewall spacer on sidewalls of the opening overlying a portion of the metal semiconductor alloy region; and
   forming an interconnect within the opening in direct contact with the metal semiconductor alloy contact.

2. The method of claim 1, wherein the gate structure is formed using a replacement gate process.

3. The method of claim 1, wherein the opening has a width ranging from 10 nm to 60 nm.

4. The method of claim 1, wherein increasing the width of the initial opening to the second width comprises an isotropic etch process.

5. The method of claim 1, wherein the increasing of the width of the initial opening to the second width comprises an isotropic dry etch comprising a $NH_3/NF_3$ chemistry.

6. The method of claim 1, wherein the increasing of the width of the initial opening to the second width comprises an isotropic wet etch comprising diluted HF (DHF), buffered BH (BHF), hydrofluoric ethylene glycol (HFEG) or a combination thereof.

7. The method of claim 1, wherein the first width ranges from 5 nm to 55 nm, and the second width ranges from 10 nm to 60 nm.

8. A method of forming a semiconductor device comprising:
   forming a gate structure on a channel portion of a semiconductor substrate, wherein a source region and a drain region are present on opposing sides of the channel portion of the semiconductor substrate;
   forming an interlevel dielectric layer over the gate structure;
   forming an opening to at least one of the source region and the drain region through the interlevel dielectric layer to an exposed surface of the semiconductor substrate containing at least one of the source region and the drain region;
   forming a metal semiconductor alloy contact on the exposed surface of the semiconductor substrate, wherein the forming of the metal semiconductor alloy contact comprises:
      depositing a metal containing layer on the exposed portion of the semiconductor substrate;
      annealing the metal containing layer to convert at least a portion of the metal containing layer and the exposed portion of the semiconductor substrate into the metal semiconductor contact; and
      removing the non-reacted portion of the metal containing layer;
   forming at least one dielectric sidewall spacer on sidewalls of the opening overlying a portion of the metal semiconductor alloy region; and
   forming an interconnect within the opening in direct contact with the metal semiconductor alloy contact.

9. The method of claim 1, wherein the forming of the spacers on the sidewalls of the opening that is overlying the portion of the metal semiconductor alloy region comprises:
 depositing a conformal dielectric layer on the sidewalls of the opening and the metal semiconductor alloy contact; and
 removing a horizontal portion of the conformal dielectric layer that is present between a vertical portion of the conformal dielectric layer that is present on the sidewalls of the opening to provide the at least one spacer.

10. The method of claim 1, wherein the metal via is composed of a metal that fills the opening and is deposited by physical vapor deposition (PVD).

11. The method of claim 1, wherein said metal semiconductor alloy contact comprises nickel silicide ($NiSi_x$), nickel platinum silicide ($NiPt_ySi_x$), cobalt silicide ($CoSi_x$), tantalum silicide ($TaSi_x$), or titanium silicide ($TiSi_x$).

12. The method of claim 1, wherein the gate structure comprises a high-k dielectric layer that is present on the channel portion of the semiconductor substrate, and a metal gate conductor that is present on the high-k dielectric layer.

13. The method of claim 1, wherein the metal semiconductor alloy contact is separated from the gate structure by a dimension ranging from 10 nm to 50 nm.

14. The method of claim 1, wherein the interconnect is composed of a metal selected from the group consisting of tungsten (W), aluminum (Al), copper (Cu), platinum (Pt), tantalum (Ta) and combinations thereof.

15. The method of claim 1, wherein the gate structure has a width ranging from 10 nm to 100 nm.

16. The method of claim 8, wherein the forming of the opening comprises:
 forming an etch mask over the dielectric layer including initial openings having a first width;
 etching the interlevel dielectric layer with an anisotropic etch that is selective to the exposed portion of the semiconductor substrate; and
 increasing the width of the initial openings to a second width to provide the openings to at least one of the source region and the drain region.

17. The method of claim 16, wherein increasing the width of the initial opening to the second width comprises an isotropic etch process.

18. The method of claim 16, wherein the increasing of the width of the initial opening to the second width comprises an isotropic dry etch comprising a $NH_3/NF_3$ chemistry.

19. The method of claim 16, wherein the increasing of the width of the initial opening to the second width comprises an isotropic wet etch comprising diluted HF (DHF), buffered BH (BHF), hydrofluoric ethylene glycol (HFEG) or a combination thereof.

* * * * *